(12) United States Patent
Oh et al.

(10) Patent No.: US 12,078,885 B2
(45) Date of Patent: Sep. 3, 2024

(54) DISPLAY DEVICE AND METHOD OF MANUFACTURING THE SAME

(71) Applicant: Samsung Display Co., LTD., Yongin-si (KR)

(72) Inventors: Myong-Soo Oh, Asan-si (KR); Minsung Kim, Suwon-si (KR); Heejong Shin, Seoul (KR); Juno Song, Jeollabuk-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/091,705

(22) Filed: Dec. 30, 2022

(65) Prior Publication Data

US 2023/0147166 A1  May 11, 2023

Related U.S. Application Data

(62) Division of application No. 16/857,872, filed on Apr. 24, 2020, now Pat. No. 11,567,357.

(30) Foreign Application Priority Data

Jul. 11, 2019 (KR) .......................... 10-2019-0083928

(51) Int. Cl.
*G02F 1/1335* (2006.01)
*G02F 1/1345* (2006.01)
*H10K 50/86* (2023.01)

(52) U.S. Cl.
CPC .. *G02F 1/133512* (2013.01); *G02F 1/133528* (2013.01); *G02F 1/13452* (2013.01); *G02F 1/13458* (2013.01); *H10K 50/865* (2023.02); *G02F 1/133531* (2021.01)

(58) Field of Classification Search
CPC .................................................. G02F 1/133512
See application file for complete search history.

(56) References Cited

U.S. PATENT DOCUMENTS

| | | | |
|---|---|---|---|
| 6,547,616 | B1 | 4/2003 | Furukawa et al. |
| 7,808,587 | B2 | 10/2010 | Shirasaka et al. |
| 9,282,666 | B2 | 3/2016 | Jang et al. |
| 10,324,343 | B2 | 6/2019 | Son et al. |
| 2014/0098513 | A1 | 4/2014 | Yi |
| 2015/0346564 | A1* | 12/2015 | Moriwaki ......... G02F 1/136286 349/138 |
| 2017/0104019 | A1* | 4/2017 | Jung ................... H01L 27/1462 |
| 2017/0285255 | A1* | 10/2017 | Nakamori ......... G02F 1/133606 |

(Continued)

FOREIGN PATENT DOCUMENTS

| | | |
|---|---|---|
| CN | 101382716 | 3/2009 |
| CN | 103376574 | 10/2013 |
| CN | 103715219 | 4/2014 |

(Continued)

*Primary Examiner* — Edmond C Lau
(74) *Attorney, Agent, or Firm* — KILE PARK REED & HOUTTEMAN PLLC

(57) ABSTRACT

A display device may include a display panel including an active area displaying an image and a peripheral area surrounding the active area, pad parts disposed on a side surface of the display panel, a light blocking layer disposed on a portion of the peripheral area adjacent to the side surface of the display panel, and circuit units electrically connected to the pad parts.

11 Claims, 12 Drawing Sheets

(56) References Cited

U.S. PATENT DOCUMENTS

2018/0081225 A1\* 3/2018 Lee .................... G02F 1/133528
2018/0173042 A1\* 6/2018 Kim ........................ H01L 24/27

FOREIGN PATENT DOCUMENTS

| CN | 107870472 | 4/2018 |
|---|---|---|
| KR | 1999-0081776 | 11/1999 |
| KR | 10-2014-0072424 | 6/2014 |
| KR | 10-1422746 | 7/2014 |
| KR | 10-2017-0005208 | 1/2017 |
| KR | 10-1715896 | 3/2017 |
| KR | 10-2018-0028097 | 3/2018 |

\* cited by examiner

DISPLAY DEVICE AND METHOD OF MANUFACTURING THE SAME

CROSS-REFERENCE TO RELATED APPLICATION

This is a divisional application of U.S. patent application Ser. No. 16/857,872, filed Apr. 24, 2020, now issued as U.S. Pat. No. 11,567,357, the disclosure of which is incorporated herein by reference in its entirety. U.S. patent application Ser. No. 16/857,872 claims priority to and benefit of Korean Patent Application No. 10-2019-0083928 under 35 U.S.C. § 119, filed on Jul. 11, 2019, in the Korean Intellectual Property Office, the entire contents of which are incorporated herein by reference.

BACKGROUND

The disclosure herein relates to a display device and a method of manufacturing the same, and, to a display device capable of reducing or minimizing a light leakage phenomenon and a method of manufacturing the same.

A display device may include a display panel including pixels and a driving chip for driving the pixels. The driving chip may be disposed on a flexible film, and the flexible film may be connected to the display panel. The driving chip may be connected to the pixels of the display panel through the flexible film. This connection type may be defined as a chip-on-film (COF) type.

Pads connected to the driving chip may be disposed on the flexible film, and the display panel may include connection pads connected to the pixels. The pads may be in contact with the connection pads, and thus the driving chip may be electrically connected to the pixels.

The pads may be connected to the connection pads by various methods. For example, the pads may be electrically connected to the connection pads by an anisotropic conductive film. In other embodiments, the pads may be connected to the connection pads by an ultrasonic bonding method.

Recently, techniques for disposing the flexible film on a side surface of the display panel have been studied in order to reduce a bezel width of the display device and to widen a display area of the display device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure may provide a display device with a reduced bezel width and a method of manufacturing the same.

The disclosure may also provide a display device capable of reducing or minimizing a light leakage phenomenon and a method of manufacturing the same.

In an embodiment, a display device may include a display panel including an active area displaying an image and a peripheral area surrounding the active area, first pad parts disposed on a first side surface of the display panel, a first light blocking layer disposed on a portion of the peripheral area adjacent to the first side surface, and first circuit units electrically connected to the first pad parts. The first light blocking layer and the first pad parts may include same material.

In an embodiment, the first light blocking layer may cover the portion of the peripheral area and a portion of the first side surface.

In an embodiment, the first light blocking layer may include first and second light blocking regions, wherein the first light blocking region may be disposed on a top surface of a substrate of the display panel, and the second light blocking region may be disposed on a side surface of the substrate of the display panel.

In an embodiment, the display device may further include second pad parts disposed on a second side surface of the display panel opposite to the first side surface, a second light blocking layer disposed on a portion of the peripheral area adjacent to the second side surface, and second circuit units electrically connected to the second pad parts. The second light blocking layer and the second pad parts may include same material.

In an embodiment, the display device may further include third pad parts disposed on a third side surface of the display panel that connects the first side surface and the second side surface, a third light blocking layer disposed on a portion of the peripheral area adjacent to the third side surface and including the same material as the third pad parts, and third circuit units electrically connected to the third pad parts.

In an embodiment, the display device may further include a fourth light blocking layer disposed on a portion of the peripheral area adjacent to a fourth side surface of the display panel. The fourth side surface may be opposite to the third side surface and may connect the first and second side surfaces.

In an embodiment, the display device may further include an upper polarizing film disposed on the display panel and covering at least a portion of the first light blocking layer. The first side surface and the second side surface may be spaced apart from each other in a first direction, and a first absorption axis of the upper polarizing film may be parallel to the first direction.

In an embodiment, widths of the first and second light blocking layers may be set based on a degree of shrinkage of the upper polarizing film and a width of the peripheral area.

In an embodiment, the first pad parts may be arranged in a second direction intersecting the first direction, and the first light blocking layer may extend in the second direction.

In an embodiment, the display device may further include a lower polarizing film disposed under the display panel and having a second absorption axis intersecting the first absorption axis of the upper polarizing film, a third light blocking layer disposed under a portion of the peripheral area adjacent to a third side surface of the display panel, the third side surface connecting the first side surface and the second side surface, and a fourth light blocking layer disposed under a portion of the peripheral area adjacent to a fourth side surface of the display panel, the fourth side surface being opposite to the third side surface.

In an embodiment, the display device may further include an ink layer disposed on the first light blocking layer.

In an embodiment, the first light blocking layer and the first pad parts may include silver (Ag).

In an embodiment, the first light blocking layer may be spaced apart from the first pad parts.

In an embodiment, a display device may include a display panel including an active area displaying an image and a peripheral area surrounding the active area, a first light blocking layer disposed on a portion of the peripheral area adjacent to a first side surface of the display panel, and an upper polarizing film disposed on the display panel and covering a portion of the first light blocking layer. A first absorption axis of the upper polarizing film may be parallel to a first direction, and the first side surface of the display panel may be spaced apart from the upper polarizing film in the first direction in a plan view.

In an embodiment, the display device may further include a second light blocking layer disposed on a portion of the peripheral area adjacent to a second side surface of the display panel opposite to the first side surface. A portion of the second light blocking layer may be covered by the upper polarizing film.

In an embodiment, the first light blocking layer and the second light blocking layer may be spaced apart from each other in the first direction, and each of the first and second light blocking layers may extend in a second direction intersecting the first direction.

In an embodiment, the display device may further include first pad parts disposed on the first side surface, second pad parts disposed on the second side surface, first circuit units electrically connected to the first pad parts, and second circuit units electrically connected to the second pad parts. The first pad parts may be arranged in a second direction intersecting the first direction, and the second pad parts may be arranged in the second direction.

In an embodiment, the first pad parts and the first light blocking layer may include same material, and the second pad parts and the second light blocking layer may include same material.

In an embodiment, the display device may further include a lower polarizing film disposed under the display panel and having a second absorption axis intersecting the first absorption axis of the upper polarizing film, a third light blocking layer disposed under a portion of the peripheral area adjacent to a third side surface of the display panel, the third side surface connecting the first side surface and the second side surface, and a fourth light blocking layer disposed under a portion of the peripheral area adjacent to a fourth side surface of the display panel, the fourth side surface being opposite to the third side surface.

In an embodiment, the display device may further include an ink layer disposed on the first light blocking layer.

In an embodiment, a method of manufacturing a display device may include forming a display panel including an active area and a peripheral area surrounding the active area, and forming metal layers on a first side surface of the display panel and a portion of the peripheral area adjacent to the first side surface.

In an embodiment, the method may further include patterning one of the metal layers to form pad parts on the first side surface of the display panel. The other one of the metal layers is a light blocking layer on the portion of the peripheral area.

In an embodiment, the pad parts and the light blocking layer may be formed of same material and may be formed at same time.

BRIEF DESCRIPTION OF THE DRAWINGS

The accompanying drawings are included to provide a further understanding, and are incorporated in and constitute a part of this specification and disclosure. The drawings illustrate embodiments and, together with the description, serve to explain principles of the disclosure. In the drawings.

DETAILED DESCRIPTION OF THE EMBODIMENTS

Figure 1:
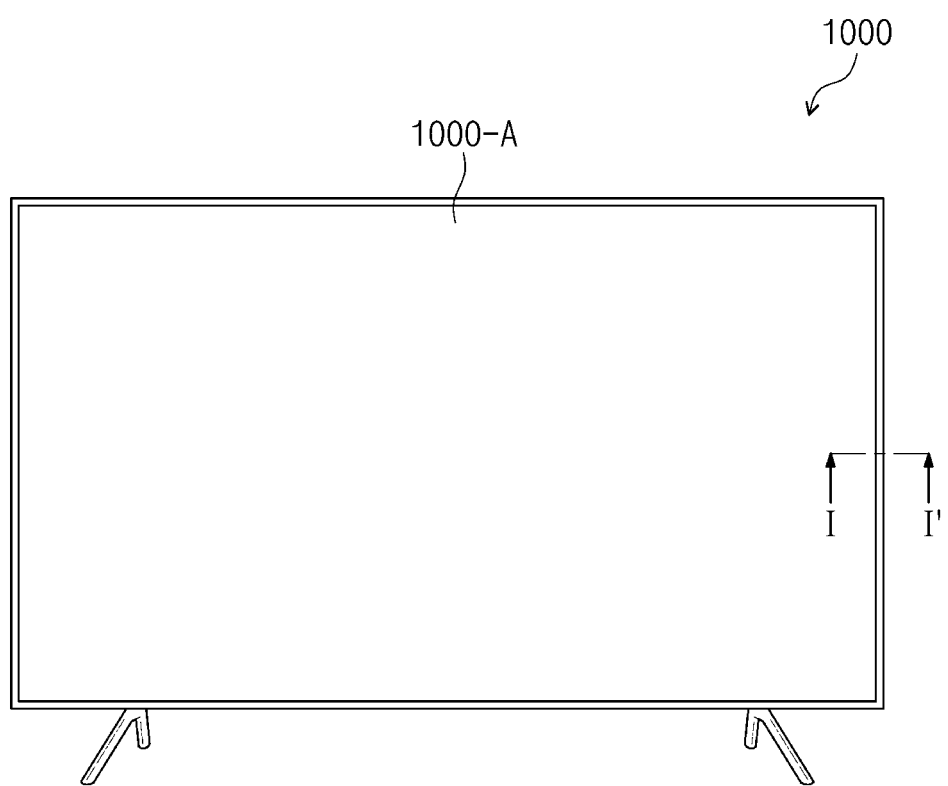
FIG. 1 is a plan view illustrating a display device according to an embodiment.

Embodiments of the disclosure will now be described more fully hereinafter with reference to the accompanying drawings, in which various embodiments are shown. The embodiments may, however, be embodied in many different forms, and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items.

The terminology used herein is for the purpose of describing various embodiments only and is not intended to be limiting. As used herein, the singular forms "a," "an," and "the" are intended to include the plural forms, including "at least one," unless the content clearly indicates otherwise. In the specification and the claims, the phrase "at least one of" is intended to include the meaning of "at least one selected from the group of" for the purpose of its meaning and interpretation. For example, "at least one of A and B" may be understood to mean "A, B, or A and B." "Or" means "and/or." As used herein, the term "and/or" includes any and all combinations of one or more of the associated listed items. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, third, for example, may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity for example, the limitations of the measurement system.

Embodiments are described herein with reference to schematic cross-sectional illustrations and/or plan illustrations that are example illustrations. In the drawings, the thicknesses of layers and regions may be exaggerated for clarity. Accordingly, variations from the shapes of the illustrations as a result, for example, of manufacturing techniques and/or tolerances, are to be expected. Thus, embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of the embodiments.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described in detail with reference to the accompanying drawings.

Figure 2:
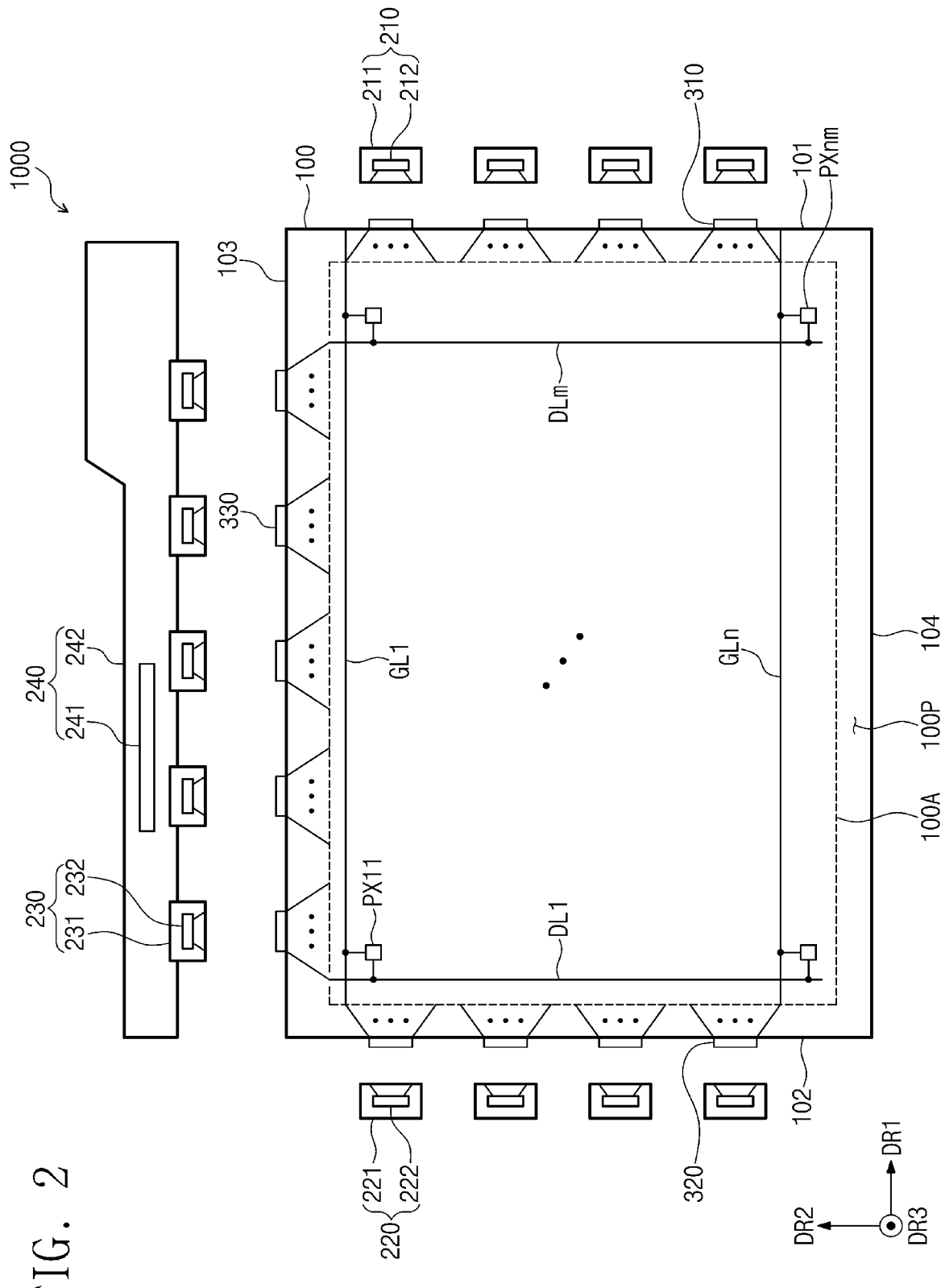
FIG. 2 is a plan view illustrating a display device according to an embodiment.

FIG. 1 is a plan view illustrating a display device 1000 according to an embodiment. FIG. 2 is a plan view illustrating the display device 1000 according to an embodiment.

Referring to FIGS. 1 and 2, a display device 1000 may be activated and or operated by an electrical signal. The display device 1000 may be realized as various sizes and shapes of display devices. For example, the display device 1000 may be used in large-sized electronic devices (for example, televisions, monitors, and external billboards) and small and middle-sized or medium-sized electronic devices (for example, personal computers, notebook computers, personal digital assistants (PDAs), vehicle or other navigation units, game consoles, portable electronic devices, and cameras). However, these are provided only as examples, and the display device 1000 may also be applied to other electronic devices without departing from the spirit and scope of the disclosure. In the embodiment, a television is illustrated as an example of the display device 1000.

The display device 1000 may display an image on a display surface 1000-A planar in first and second directions DR1 and DR2. The image may be displayed towards a third direction DR3. The image may include a dynamic image and/or a static image.

A bezel of the display device 1000 may be defined by an area between a contour of the display surface 1000-A and an outermost contour of the display device 1000. As a width of the bezel decreases, an occupancy ratio of the display surface 1000-A on one surface (for example, a front surface) of the display device 1000 may increase. As another example, when display devices 1000 are connected to each other to constitute a video wall, a boundary between the display devices 1000 may not be visible as the width of the bezel decreases, and thus an effect of watching a single connected screen may be obtained.

The display device 1000 may include a display panel 100, first circuit units 210, second circuit units 220, third circuit units 230, a main circuit unit 240, first pad parts 310, second pad parts 320, and third pad parts 330. The pad parts may be referred to as pad members, pad portions, pad units, or pad groups.

An active area 100A and a peripheral area 100P may be defined in the display panel 100. The active area 100A may be an area that is activated by an electrical signal. For example, the active area 100A may be an area in which an image is displayed. The peripheral area 100P may surround the active area 100A when viewed in a plan view. A driving circuit and/or driving lines for driving the active area 100A may be disposed in the peripheral area 100P.

The display panel 100 may include pixels PX11 to PXnm, gate lines GL1 to GLn, and data lines DL1 to DLm. The pixels PX11 to PXnm, the gate lines GL1 to GLn and the data lines DL1 to DLm may be disposed in the active area 100A.

Each of the gate lines GL1 to GLn may extend in the first direction DR1. The gate lines GL1 to GLn may be spaced apart from each other and may be arranged in the second direction DR2. Each of the data lines DL1 to DLm may extend in the second direction DR2. The data lines DL1 to DLm may be spaced apart from each other and may be arranged in the first direction DR1. Each of the pixels PX11 to PXnm may be electrically connected to a corresponding one of the data lines DL1 to DLm and a corresponding one of the gate lines GL1 to GLn.

The display panel 100 may include a first side surface 101, a second side surface 102, a third side surface 103, and a fourth side surface 104. The first side surface 101 and the second side surface 102 may be spaced apart from each other in the first direction DR1, and each of the first and second side surfaces 101 and 102 may extend in the second direction DR2. Each of the third and fourth side surfaces 103 and 104 may connect the first side surface 101 and the second side surface 102. The third side surface 103 and the fourth side surface 104 may be spaced apart from each other in the second direction DR2, and each of the third and fourth side surfaces 103 and 104 may extend in the first direction DR1.

The first pad parts 310 may be disposed on the first side surface 101, the second pad parts 320 may be disposed on the second side surface 102, and the third pad parts 330 may be disposed on the third side surface 103. The first pad parts 310 may be arranged in the second direction DR2, the second pad parts 320 may be arranged in the second direction DR2, and the third pad parts 330 may be arranged in the first direction DR1. However, the arrangement of the first pad parts 310, second pad parts 320 and third pad parts 330 is not limited thereto and the pad parts may be arranged in any direction within the spirit and scope of the disclosure.

Each of the first pad parts 310 and the second pad parts 320 may be electrically connected to corresponding ones of the gate lines GL1 to GLn. Each of the third pad parts 330 may be electrically connected to corresponding ones of the data lines DL1 to DLm.

The first circuit units 210 may be electrically connected to the first pad parts 310, respectively, the second circuit units 220 may be electrically connected to the second pad parts 320, respectively, and the third circuit units 230 may be electrically connected to the third pad parts 330, respectively. The various circuit units may be connected to the various pad parts within the spirit and scope of the disclosure.

The first circuit units 210 and the second circuit units 220 may be referred to as a gate driving circuit. The third circuit units 230 may be referred to as a data driving circuit. By way of example, the first to third circuit units 210, 220 and 230 may also be referred to as first to third chip-on-films, respectively.

Each of the first circuit units 210 may include a first circuit film 211 and a first driving chip 212. Each of the second circuit units 220 may include a second circuit film 221 and a second driving chip 222. Each of the third circuit units 230 may include a third circuit film 231 and a third driving chip 232.

In FIG. 2, one gate line GL1 is connected to both one of the first circuit units 210 and one of the second circuit units 220. However, embodiments are not limited thereto. In another embodiment, odd-numbered gate lines of the gate lines GL1 to GLn may be electrically connected to the first circuit units 210, and even-numbered gate lines of the gate lines GL1 to GLn may be electrically connected to the second circuit units 220. In another embodiment, the first circuit units 210 and the first pad parts 310 may be omitted. In this case, the gate lines GL1 to GLn may be electrically connected to the second circuit units 220 through the second pad parts 320.

The main circuit unit 240 may include a signal controller 241 and a main circuit board 242. The signal controller 241 may also be referred to as a timing controller. The signal controller 241 may be provided in the form of an integrated circuit chip and may be mounted on the main circuit board 242. The signal controller 241 may be electrically connected to the first circuit units 210 and the second circuit units 220 through the third circuit units 230.

The first circuit units 210 and the second circuit units 220 may receive a gate control signal from the signal controller 241. The first circuit units 210 and the second circuit units 220 may generate gate signals in response to the gate control signal and may sequentially output the generated gate signals. The gate signals may be provided to the pixels PX11 to PXnm through the gate lines GL1 to GLn. The pixels PX11 to PXnm may be driven in rows in response to the gate signals.

The third circuit units 230 may receive image data and a data control signal from the signal controller 241. The third circuit units 230 may generate and output analog data voltages corresponding to the image data in response to the data control signal. The data voltages may be provided to the pixels PX11 to PXnm through the data lines DL1 to DLm.

Figure 3:
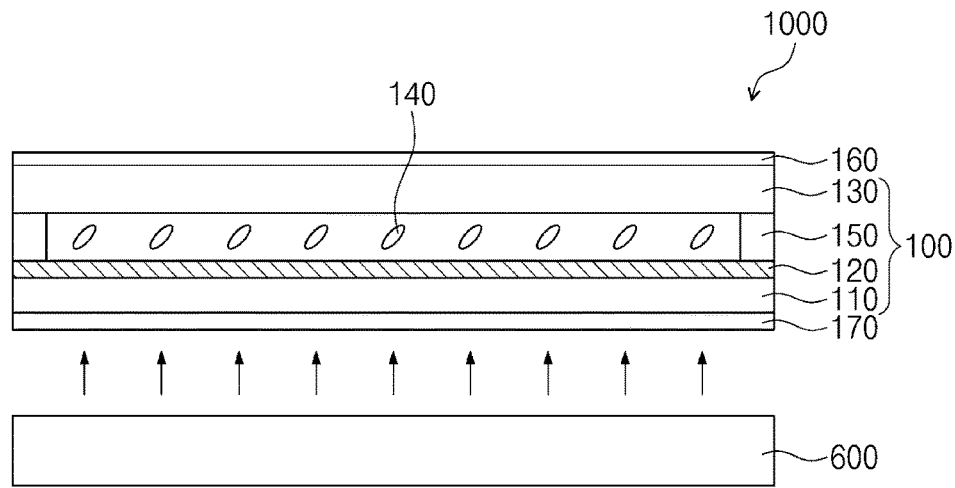
FIG. 3 is a schematic cross-sectional view illustrating a display device according to an embodiment.

FIG. 3 is a schematic cross-sectional view illustrating a display device 1000 according to an embodiment.

Referring to FIG. 3, the display device 1000 may be a liquid crystal display device, but the embodiments are not limited thereto. The display device 1000 may include the display panel 100, an upper polarizing film 160, a lower polarizing film 170, and a backlight unit 600. The display panel 100 may include a first substrate 110, a conductive layer 120, a second substrate 130, a liquid crystal layer 140, and a sealant 150.

The first substrate 110 may include a base substrate, transistors, signal lines, pixel electrodes, and insulating layers. The first substrate 110 may be referred to as a transistor substrate. The conductive layer 120 may be a component included in the first substrate 110.

The conductive layer 120 may include lines electrically connected to the first to third pad parts 310, 320 and 330 as described above and in reference to the first to third pad parts 310, 320 and 330 of FIG. 2. The conductive layer 120 may be electrically connected to the transistors.

The second substrate 130 may face the first substrate 110. The second substrate 130 may include a base substrate, a common electrode, a color filter, and a light blocking layer. The second substrate 130 may also be referred to as an opposite substrate or a color filter substrate.

In an embodiment, the second substrate 130 may include only the base substrate. In this case, the first substrate 110 may include the common electrode, the color filter, and the light blocking layer. Components constituting the first and second substrates 110 and 130 may be variously changed and/or modified, and the disclosure is not limited to a specific embodiment.

The liquid crystal layer 140 may be disposed between the first substrate 110 and the second substrate 130. The liquid crystal layer 140 may include liquid crystal molecules having dielectric anisotropy. Arrangement of the liquid crystal molecules may be changed depending on electric fields applied and or formed between the common electrode and the pixel electrodes.

The sealant 150 may be disposed between the first substrate 110 and the second substrate 130. The sealant 150 may couple the first substrate 110 and the second substrate 130 to each other. The sealant 150 may include an organic material such as a photocurable resin or a photoplastic resin or may include an inorganic material such as a frit seal.

The upper polarizing film 160 may be disposed on a top or upper surface of the second substrate 130, and the lower polarizing film 170 may be disposed on a bottom or lower surface of the first substrate 110. Each of the upper polarizing film 160 and the lower polarizing film 170 may be an absorption-type polarizer which transmits light vibrating in one direction and absorbs light vibrating in another direction perpendicular to the one direction. A transmission axis of the upper polarizing film 160 may be different from a transmission axis of the lower polarizing film 170.

The backlight unit 600 may be disposed under the display panel 100. The backlight unit 600 may provide light toward the display panel 100. The backlight unit 600 may include a light source. The light source may provide white light. In an embodiment, the light source may provide blue light. By way of example, the backlight unit 600 may include a wavelength conversion member for converting the blue light into white light.

Figure 4:
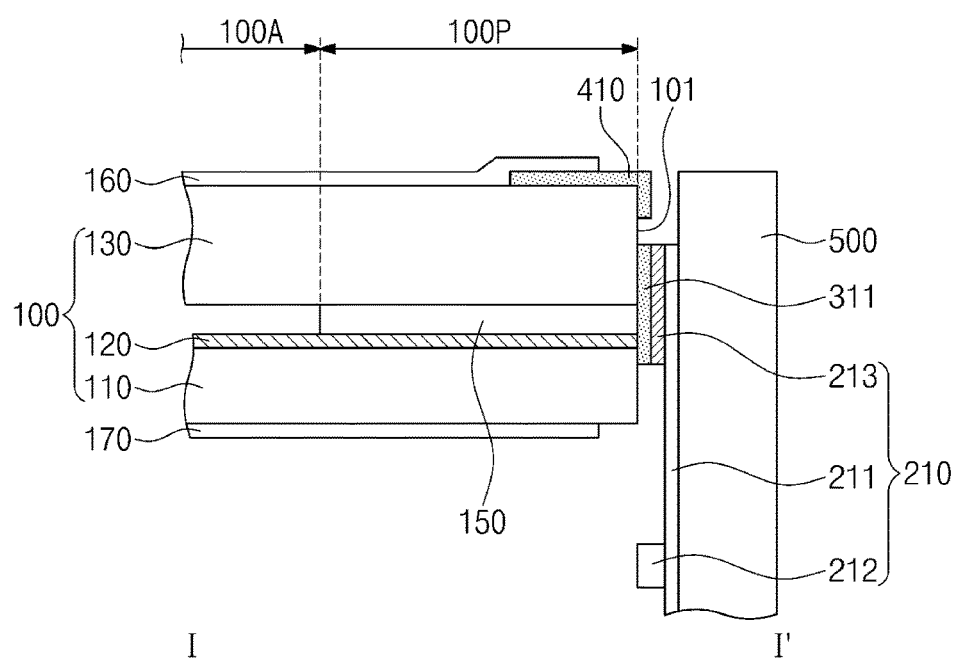
FIG. 4 is a schematic cross-sectional view taken along line I-I' of FIG. 1.
Figure 4:
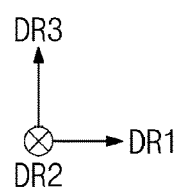
Figure 5:
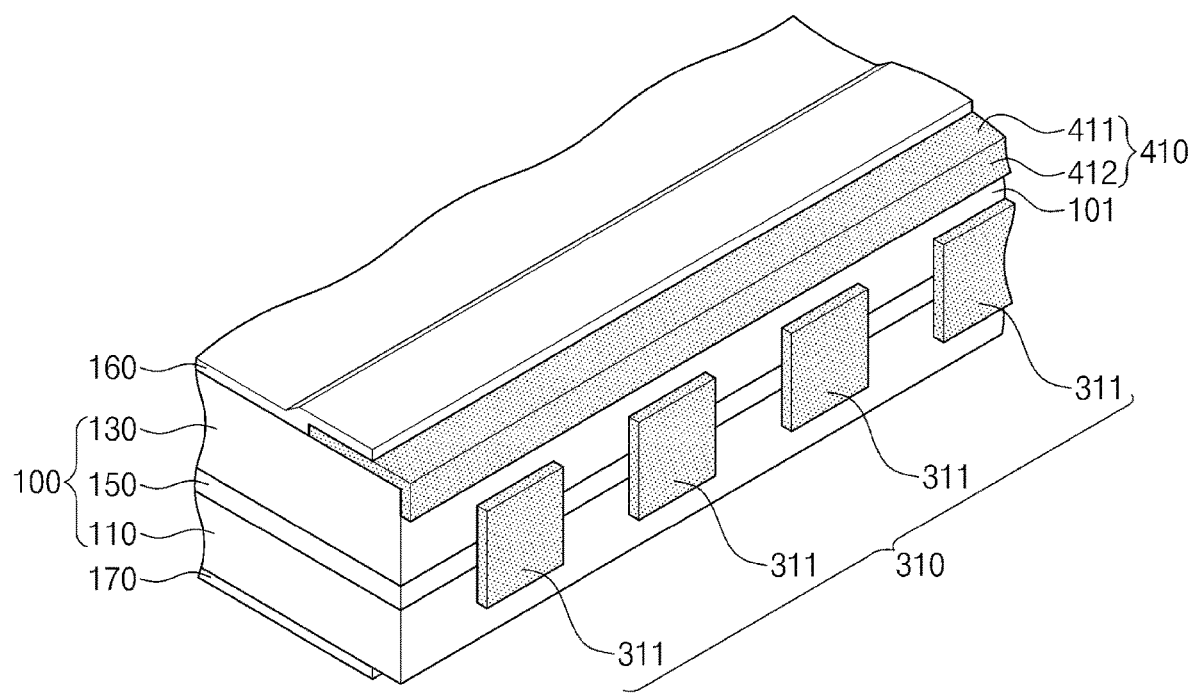
FIG. 5 is a perspective view illustrating a display device according to an embodiment.

FIG. 4 is a schematic cross-sectional view taken along line I-I' of FIG. 1. FIG. 5 is a perspective view illustrating components of a display device according to an embodiment.

Referring to FIGS. 4 and 5, each of the first pad parts 310 may include first pads 311. The first pads 311 may be disposed on the first side surface 101 of the display panel 100. The first pads 311 may be spaced apart from each other and may be arranged in the second direction DR2.

The first pads 311 may be electrically connected to the lines included in the conductive layer 120, respectively. The first pads 311 may be electrically connected to the first circuit units 210. Each of the first circuit units 210 may include first driving electrodes 213 disposed on the first circuit film 211. The first driving electrodes 213 may be electrically connected to the first pads 311.

In an embodiment, the first driving electrodes 213 may be in direct contact with the first pads 311 by an ultrasonic bonding process. In an embodiment, an anisotropic conductive film may be disposed between the first driving electrodes 213 and the first pads 311. In this case, the first driving electrodes 213 may be electrically connected to the first pads 311 through the anisotropic conductive film.

A first light blocking layer 410 may be disposed on a portion of the display panel 100. For example, the first light blocking layer 410 may be disposed on a portion of the peripheral area 100P, which may be adjacent to the first side surface 101.

The first light blocking layer 410 may include a first light blocking region 411 and a second light blocking region 412. The first and second light blocking regions 411 and 412 may be integral or separate light blocking regions and may be formed or disposed as layers or films in keeping with the spirit and scope of the disclosure. The first light blocking region 411 may be disposed on the top or upper surface of the second substrate 130. The second light blocking region 412 may be disposed on a side surface of the second substrate 130. The first light blocking layer 410 may have a bent shape when viewed in a schematic cross-sectional view.

The first light blocking layer 410 may be spaced apart from the first pad parts 310 and may extend in the second direction DR2.

The upper polarizing film 160 may be disposed on the display panel 100. For example, the upper polarizing film 160 may cover at least a portion of the first light blocking layer 410. For example, the upper polarizing film 160 may cover at least a portion of the first light blocking region 411. In an embodiment, the upper polarizing film 160 may cover the entire first light blocking region 411.

The first light blocking layer 410 may include the same material as the first pad parts 310. For example, the first light blocking layer 410 and the first pad parts 310 may include silver (Ag). After the first light blocking layer 410 and the first pad parts 310 are formed, the upper polarizing film 160 may be adhered to the display panel 100. Thus, at least a portion of the first light blocking layer 410 may be disposed between the upper polarizing film 160 and the display panel 100.

When portions of the upper polarizing film 160 and the lower polarizing film 170 are shrunken or contracted, a light leakage phenomenon may occur at an edge portion of the display panel 100, on which the upper polarizing film 160 and the lower polarizing film 170 are not disposed. According to the embodiments, even though portions of the upper polarizing film 160 and the lower polarizing film 170 may be shrunken, transmission of light may be prevented by the first light blocking layer 410. Thus, the light leakage phenomenon occurring at the edge portion of the display panel 100 may be reduced or prevented by the first light blocking layer 410.

A housing 500 may surround a periphery of the display panel 100. The housing 500 may form an exterior of the display device 1000, for example, the display device as illustrated in FIG. 1. The housing 500 may be formed of a material having a relatively high rigidity as may be appreciated and understood by those of ordinary skill in the art. For example, the housing 500 may include frames and/or plates formed of glass, plastic, a metal, or a combination thereof.

Figure 6:
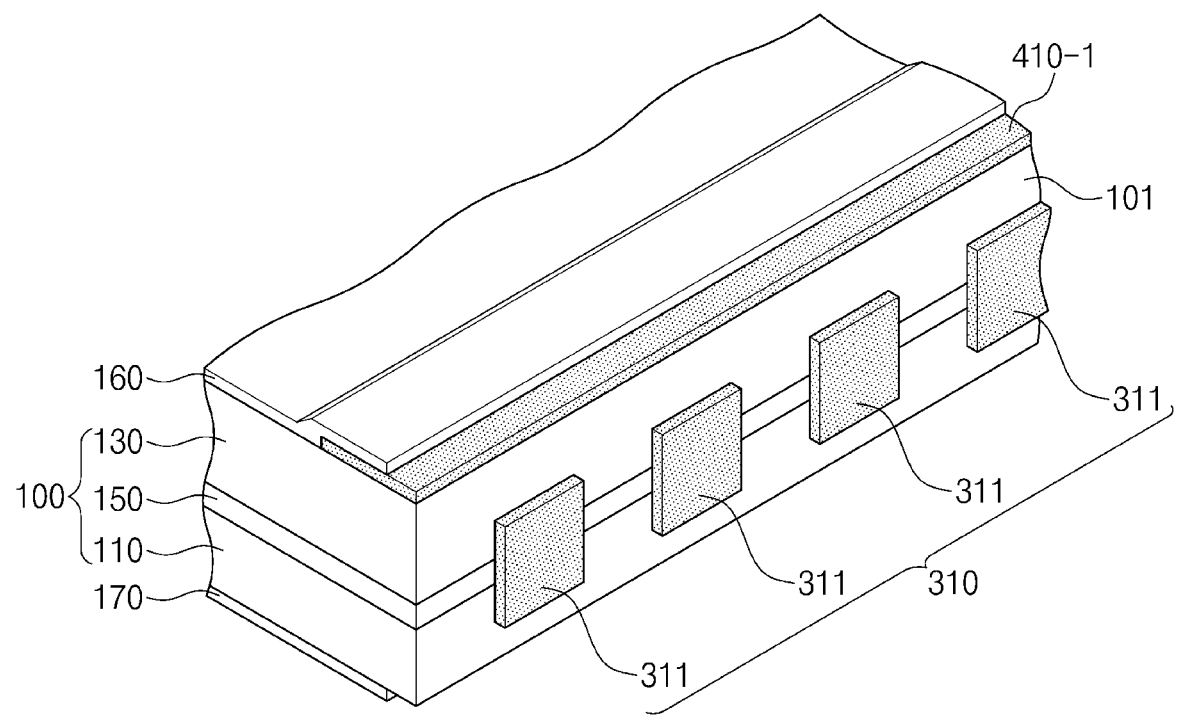
FIG. 6 is a perspective view illustrating a display device according to an embodiment.

FIG. 6 is a perspective view illustrating a display device according to an embodiment.

When the embodiment of FIG. 6 is compared with the embodiment of FIG. 5, a shape of a first light blocking layer 410-1 may be different from that of the first light blocking layer 410. The first light blocking layer 410-1 may be disposed on only the top or upper surface of the display panel 100. The first light blocking layer 410-1 may extend in the second direction DR2.

At least a portion of the first light blocking layer 410-1 may be covered by the upper polarizing film 160. According to the embodiment, even though the upper polarizing film 160 may be shrunken or contracted, the top or upper surface of the display panel 100 may be covered by the first light blocking layer 410-1, thereby reducing or preventing the light leakage phenomenon.

Figure 7:
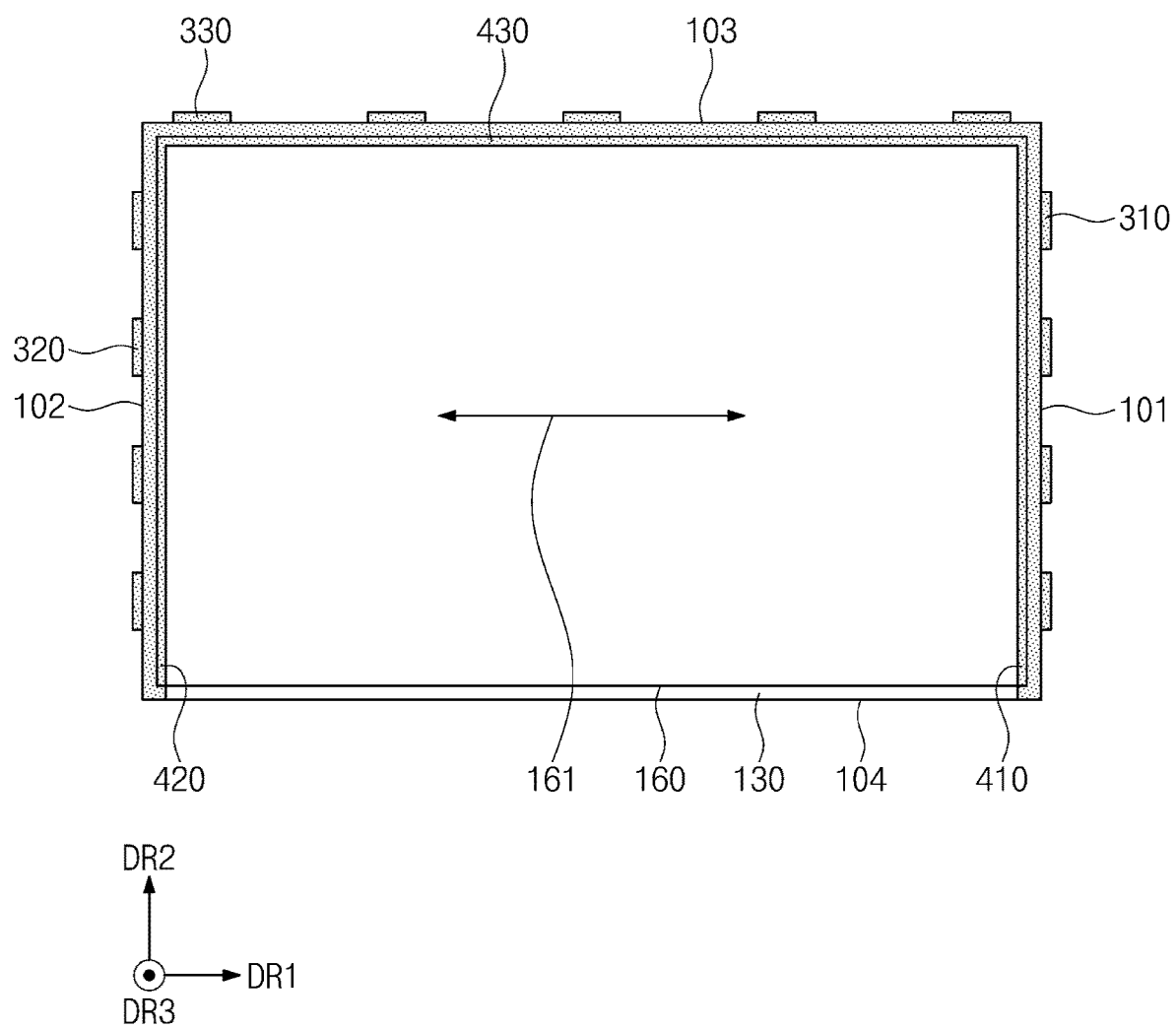
FIG. 7 is a plan view illustrating a display device according to an embodiment.

FIG. 7 is a plan view illustrating a display device according to an embodiment.

Referring to FIG. 7, a first light blocking layer 410, a second light blocking layer 420 and a third light blocking layer 430 may be disposed on the second substrate 130. At least a portion of each of the first, second and third light blocking layers 410, 420 and 430 may be covered by the upper polarizing film 160.

The first light blocking layer 410 may be disposed on a portion of the second substrate 130, which may be adjacent to the first side surface 101. The second light blocking layer 420 may be disposed on a portion of the second substrate 130, which may be adjacent to the second side surface 102. The third light blocking layer 430 may be disposed on a portion of the second substrate 130, which may be adjacent to the third side surface 103.

The first light blocking layer 410 may include the same material as the first pad parts 310. The first light blocking layer 410 and the first pad parts 310 may include same material. The first light blocking layer 410 and the first pad parts 310 may be formed by a same process. The first light blocking layer 410 and the first pad parts 310 may be formed at same time. The second light blocking layer 420 may include the same material as the second pad parts 320. The second light blocking layer 420 and the second pad parts 320 may include same material. The second light blocking layer 420 and the second pad parts 320 may be formed by a same process. The second light blocking layer 420 and the second pad parts 320 may be formed at same time. The third light blocking layer 430 may include the same material as the third pad parts 330. The third light blocking layer 430 and the third pad parts 330 may include same material. The third light blocking layer 430 and the third pad parts 330 may be formed by a same process. The third light blocking layer 430 and the third pad parts 330 may be formed at same time. The first to third light blocking layers 410, 420 and 430 may be formed using a process of forming the first to third pad parts 310, 320 and 330 without an additional process.

The upper polarizing film 160 may be an elongated polarizing film. In this case, an elongation direction may be parallel to an absorption axis 161 of the upper polarizing film 160. The absorption axis 161 may be parallel to the first direction DR1. In this case, a degree of shrinkage in the first direction DR1 of the upper polarizing film 160 may be greater than a degree of shrinkage in the second direction DR2 of the upper polarizing film 160. The degree of shrinkage of the upper polarizing film 160 may be changed depending on various factors, however, and may be about 400 micrometers. For example, a portion of the upper polarizing film 160 overlapping the second light blocking layer 420 may be shrunken by about 200 micrometers, and a portion of the upper polarizing film 160 overlapping the first light blocking layer 410 may be shrunken by about 200 micrometers. In this case, a width in the first direction DR1 of each of the first and second light blocking layers 410 and 420 may be about 200 micrometers or more. The widths of the first and second light blocking layers 410 and 420 may be set in consideration of the degree of shrinkage of the upper polarizing film 160 and a width of the peripheral area 100P, for example, the peripheral area 100P as illustrated in FIG. 2.

According to the embodiment, the first light blocking layer 410, the second light blocking layer 420 and the third light blocking layer 430 may be disposed under the upper polarizing film 160. Thus, even though a portion of the upper polarizing film 160 may be shrunken, a light leakage phenomenon may be prevented by the first, second and third light blocking layers 410, 420 and 430.

Figure 8:
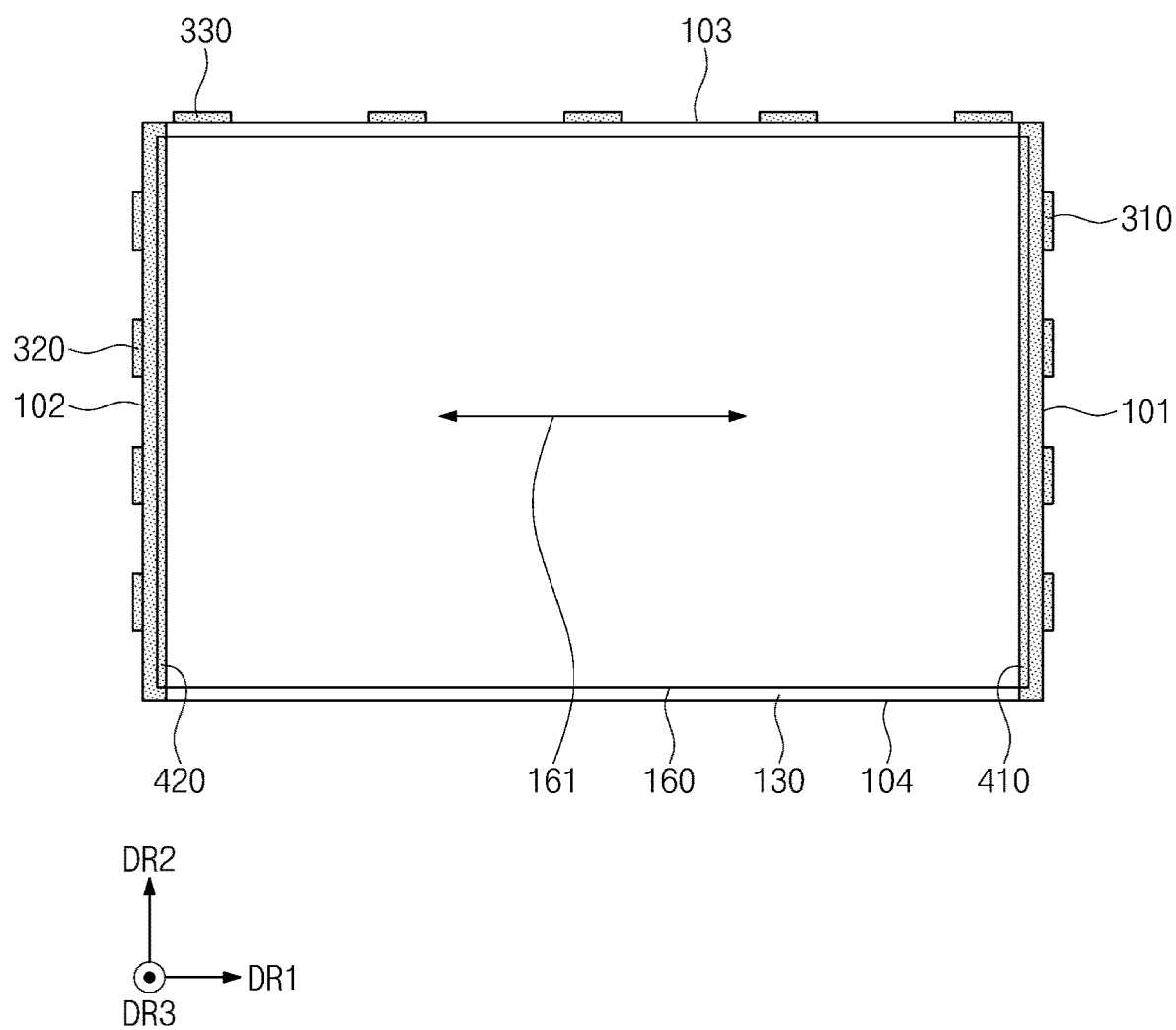
FIG. 8 is a plan view illustrating a display device according to an embodiment.

FIG. 8 is a plan view illustrating a display device according to an embodiment.

When the embodiment of FIG. 8 is compared with the embodiment of FIG. 7, the third light blocking layer 430 as illustrated for example in FIG. 7 may be omitted. As described above with reference to FIG. 7, the degree of shrinkage in the first direction DR1 of the upper polarizing film 160 may be greater than the degree of shrinkage in the second direction DR2 of the upper polarizing film 160. Thus, even though only the first and second light blocking layers 410 and 420 may be disposed, a light leakage phenomenon occurring at an edge portion of the display panel 100 the display panel 100 for example as illustrated in FIG. 4, may be reduced.

Figure 9:
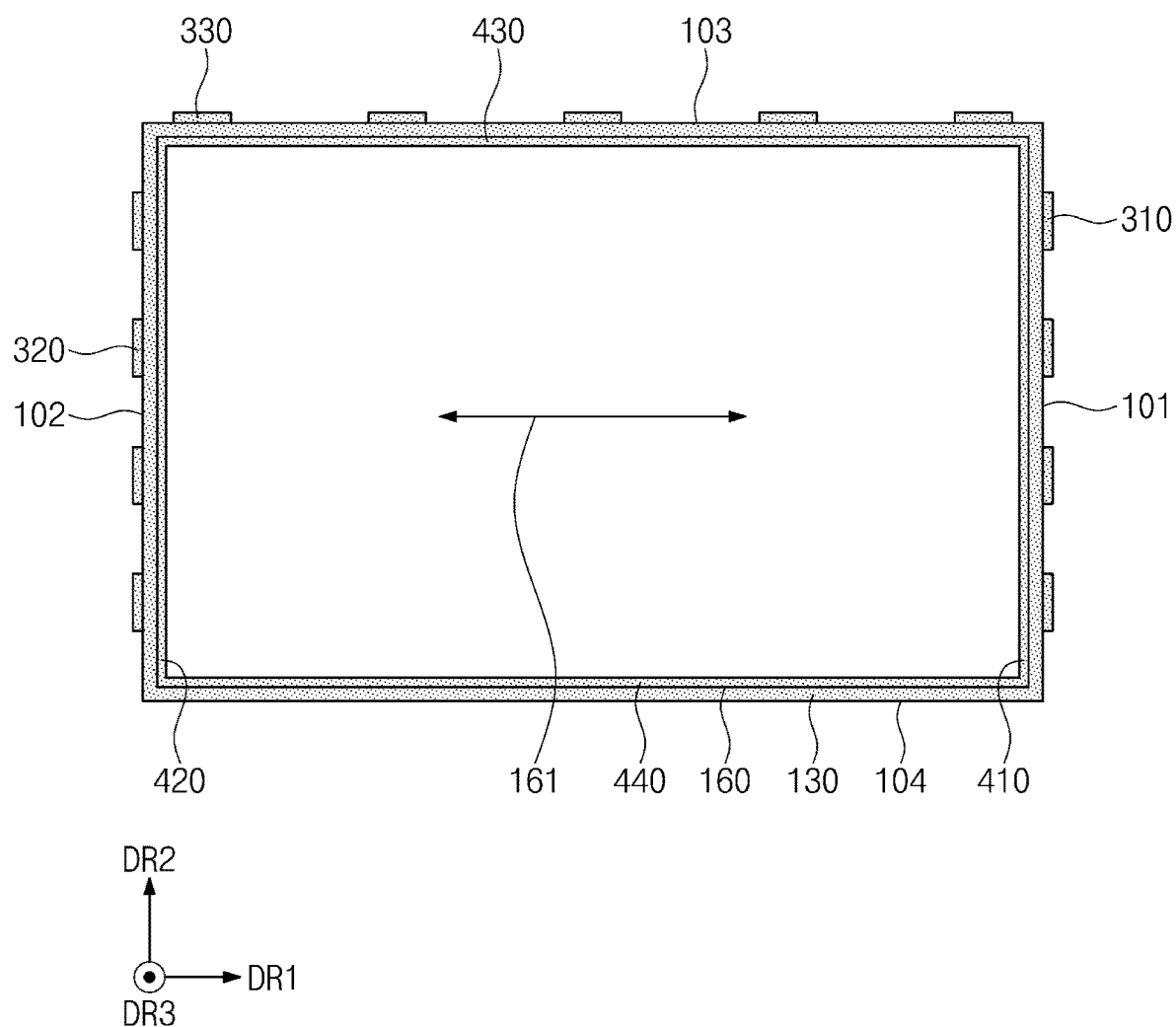
FIG. 9 is a plan view illustrating a display device according to an embodiment.

FIG. 9 is a plan view illustrating a display device according to an embodiment.

When the embodiment of FIG. 9 is compared with the embodiment of FIG. 7, a fourth light blocking layer 440 may be provided. The fourth light blocking layer 440 may be disposed on a portion of the second substrate 130, which may be adjacent to the fourth side surface 104. At least a portion of the fourth light blocking layer 440 may be covered by the upper polarizing film 160.

According to the embodiment, since the whole of an edge portion of the display panel 100 of FIG. 4, for example, may be covered by the first to fourth light blocking layers 410, 420, 430 and 440, the light leakage phenomenon occurring at the edge portion of the display panel 100 of FIG. 4, for example, may be reduced or prevented.

Figure 10:
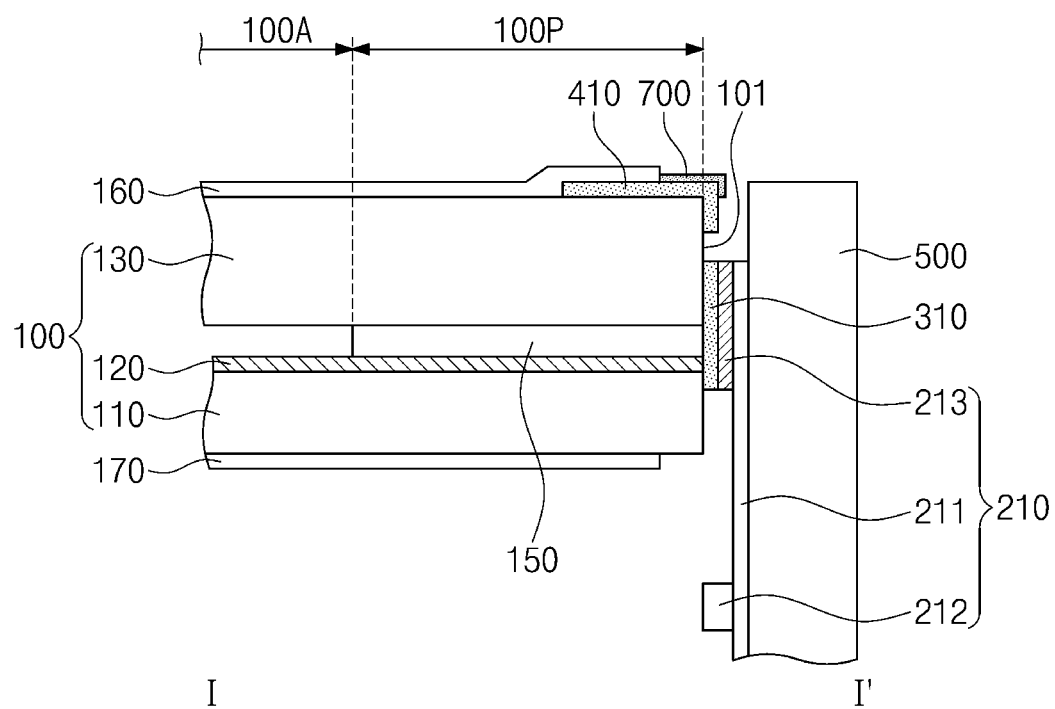
FIG. 10 is a schematic cross-sectional view taken along line I-I' of FIG. 1.
Figure 10:
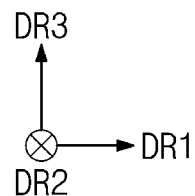

FIG. 10 is a schematic cross-sectional view taken along line I-I' of FIG. 1.

When the embodiment of FIG. 10 is compared with the embodiment of FIG. 4, an ink layer 700 may be provided on the first light blocking layer 410. The ink layer 700 may have a black color. For example, the ink layer 700 may include a black dye or a black pigment or other suitable dye or pigment. The light leakage phenomenon occurring at the edge portion of the display panel 100 may be additionally reduced or prevented by the ink layer 700.

The ink layer 700 may be applied to the embodiments described above. For example, the ink layer 700 may be disposed on the first to third light blocking layers 410, 420 and 430 of FIG. 7. The ink layer 700 may be disposed on the first and second light blocking layers 410 and 420 of FIG. 8. The ink layer 700 may be disposed on the first to fourth light blocking layers 410, 420, 430 and 440 of FIG. 9.

Figure 11:
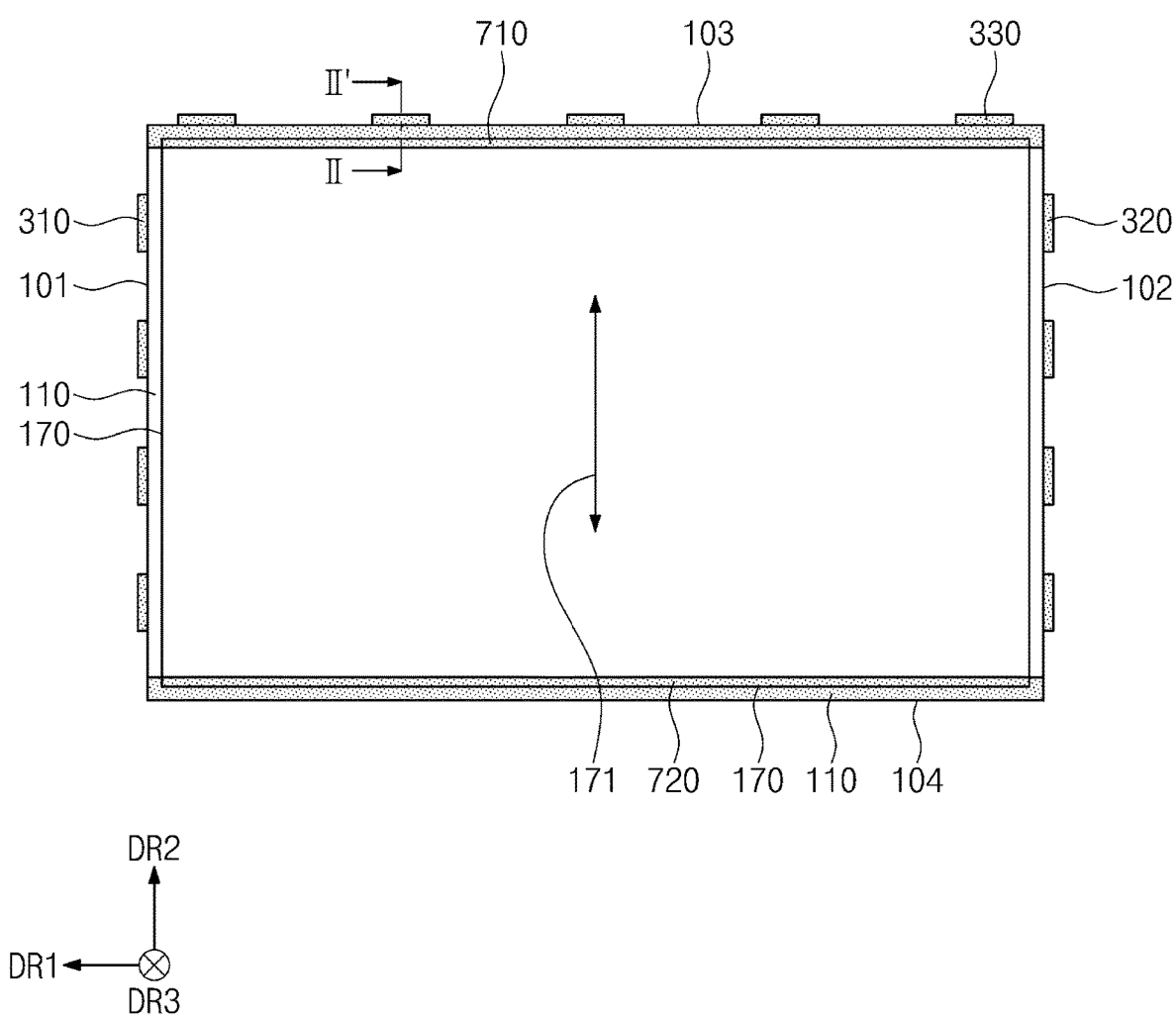
FIG. 11 is a rear view illustrating a display device according to an embodiment.
Figure 12:
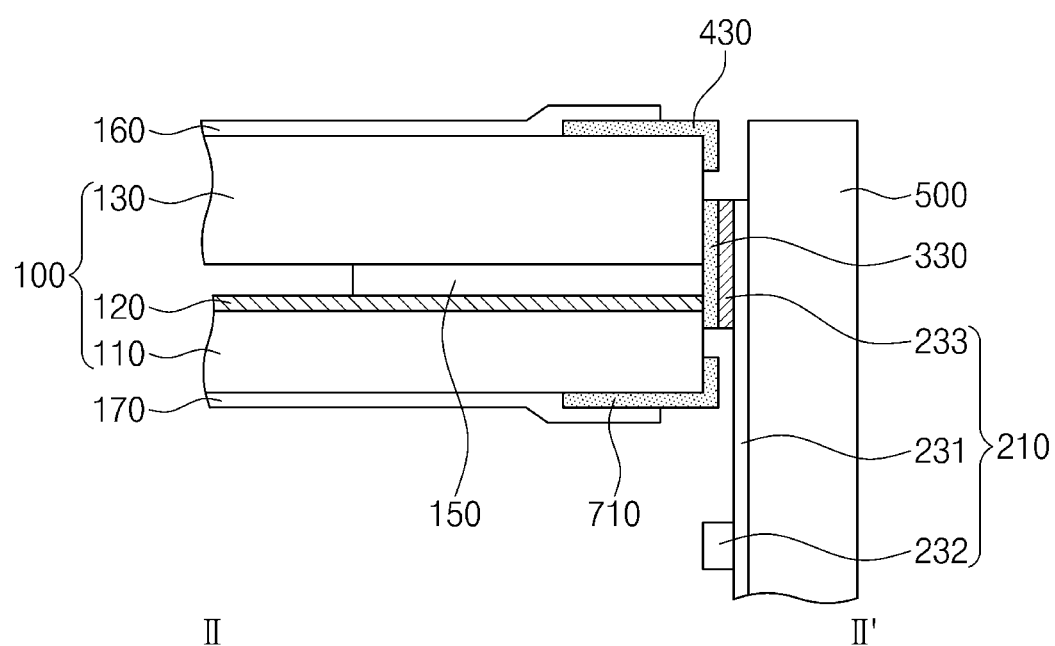
FIG. 12 is a schematic cross-sectional view taken along line II-IF of FIG. 11.
Figure 12:
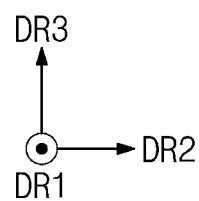

FIG. 11 is a rear view illustrating a display device according to an embodiment. FIG. 12 is a schematic cross-sectional view taken along line II-IF of FIG. 11.

Referring to FIGS. 11 and 12, the lower polarizing film 170 may be an elongated polarizing film. In this case, an elongation direction may be parallel to an absorption axis 171 of the lower polarizing film 170. The absorption axis 171 may be parallel to the second direction DR2. In this case, a degree of shrinkage in the second direction DR2 of the lower polarizing film 170 may be greater than a degree of shrinkage in the first direction DR1 of the lower polarizing film 170.

A first lower light blocking layer 710 and a second lower light blocking layer 720 may be disposed between a portion of the lower polarizing film 170 and the first substrate 110. For example, the first lower light blocking layer 710 may be disposed adjacent to the third side surface 103, and the second lower light blocking layer 720 may be disposed adjacent to the fourth side surface 104. The first lower light blocking layer 710 and the second lower light blocking layer 720 may be disposed adjacent to any side surface and thus the embodiment is not limited thereto. The first lower light blocking layer 710, the third pad parts 330 and the third light blocking layer 430 may be formed at the same time by the same process.

In an embodiment, the second lower light blocking layer 720 may be omitted. In an embodiment, the display device may include a third lower light blocking layer (not shown) adjacent to the first side surface 101 and a fourth lower light blocking layer (not shown) adjacent to the second side surface 102. The embodiment of FIG. 11 may be combined with the embodiments described above. For example, the embodiment of FIG. 11 may be combined with the embodiment of FIG. 8. In this case, a light leakage phenomenon may be prevented by the first and second light blocking layers 410 and 420 as illustrated in FIG. 8, for example, even if the upper polarizing film 160 of FIG. 8 is shrunken, and a light leakage phenomenon may be prevented by the first and second lower light blocking layers 710 and 720 even if the lower polarizing film 170 is shrunken.

Figure 13:
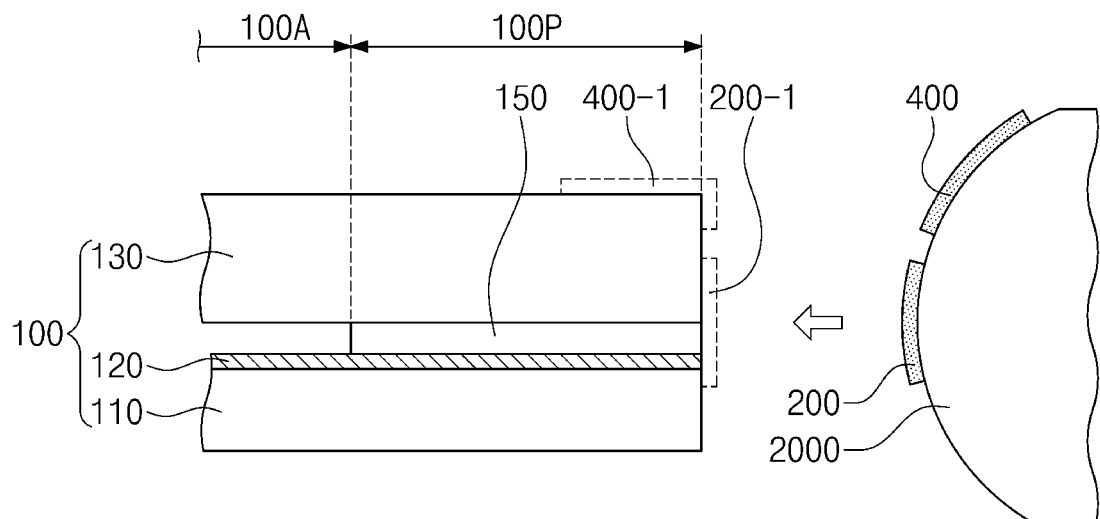
FIG. 13 is a schematic cross-sectional view for explaining a method of manufacturing a display device according to an embodiment.
Figure 13:
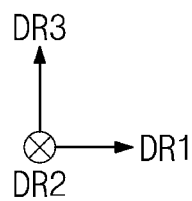

FIG. 13 is a schematic cross-sectional view for explaining a method of manufacturing a display device according to an embodiment.

Referring to FIG. 13, transfer metal layers 200 and 400 may be formed on a printing rubber 2000. The printing rubber 2000 may include silicon. The printing rubber 2000 may be easily deformable.

Metal layers 200-1 and 400-1 may be formed on one side surface of the display panel 100 and a portion of the peripheral area 100P adjacent to the one side surface by using the printing rubber 2000.

The metal layers 200-1 and 400-1 may include the same or similar material. The metal layers 200-1 and 400-1 may be formed at the same time. Thereafter, first-hardening the metal layers 200-1 and 400-1 by application of a laser, pressing the metal layers 200-1 and 400-1 by applying a pressing tool, and second-hardening the metal layers 200-1 and 400-1 by application of a laser may be sequentially performed. The lasers of the first and second hardenings may be the same or different. Subsequently, the metal layer 200-1 may be patterned to form the first pads 311 as illustrated, for example, in FIG. 5. An upper polarizing film 160, as illustrated for example in FIG. 4-, covering at least a portion of the metal layer 400-1 may be adhered onto the display panel 100.

Figure 14:
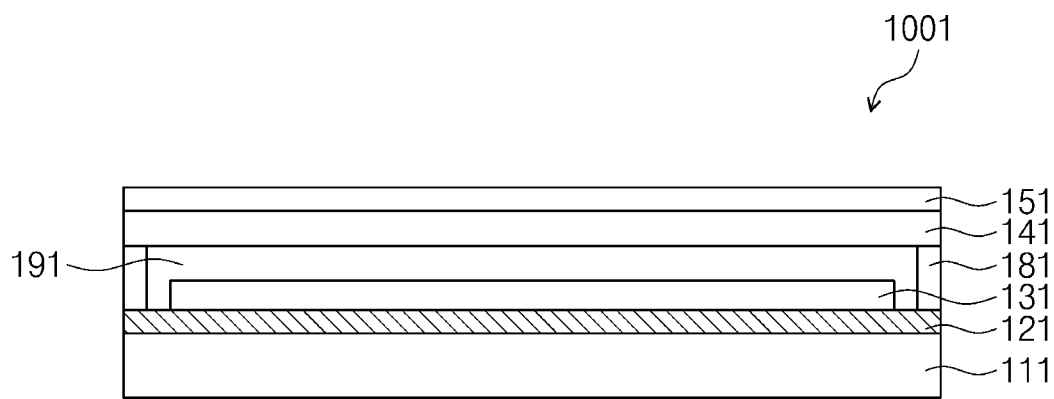
FIG. 14 is a schematic cross-sectional view illustrating a display device according to an embodiment.

FIG. 14 is a schematic cross-sectional view illustrating a display device according to an embodiment.

Referring to FIG. 14, a display device 1001 may be an organic light emitting display device. The display device 1001 may include a base substrate 111, a circuit layer 121, a light emitting element layer 131, an encapsulation substrate 141, a polarizing film 151, and a sealant 181.

Each of the base substrate 111 and the encapsulation substrate 141 may be a plastic substrate, a glass substrate, an insulating film, or a stack structure including insulating layers, by way of non-limiting example.

The circuit layer 121 may be disposed on the base substrate 111. The circuit layer 121 may include insulating layers, conductive layers, and a semiconductor layer. The conductive layers may constitute signal lines and/or a control circuit of a pixel.

The light emitting element layer 131 may be disposed on the circuit layer 121. The light emitting element layer 131 may be a layer for generating light. For example, the light emitting element layer 131 of the organic light emitting display device may include an organic light emitting material. The light emitting element layer 131 of a quantum-dot light emitting display device may include at least one of a quantum dot or a quantum rod.

The encapsulation substrate 141 may be disposed on the light emitting element layer 131. A space, cavity, or aperture 191 may be defined between the encapsulation substrate 141 and the light emitting element layer 131. The space, cavity, or aperture 191 may be filled with air or an inert gas. In other embodiments, the space, cavity, or aperture 191 may be filled with a filler such as a silicon-based polymer, an epoxy-based resin, or an acrylic-based resin. Even though not shown in the drawings, an input sensing layer for sensing a touch may further be provided on the encapsulation substrate 141.

The polarizing film 151 may be disposed on the encapsulation substrate 141. The polarizing film 151 may reduce reflection of external light. The light blocking layers described above with reference to FIGS. 4 to 12 may be disposed between the polarizing film 151 and the encapsulation substrate 141.

According to the embodiments, even though a portion of the polarizing film may be shrunken, transmission of light may be prevented by the light blocking layer overlapping with a portion of the polarizing film. Thus, a light leakage phenomenon occurring at an edge portion of the display panel may be reduced or prevented by the light blocking layer, or light blocking layers.

While the disclosure has been described with reference to example embodiments, it will be apparent to those skilled in the art that various changes and modifications may be made without departing from the spirit and scope of the disclosure. Therefore, it should be understood that the above embodiments are not limiting, but illustrative. Thus, the scope of the disclosure is to be determined by the broadest permissible interpretation of the following claims and their equivalents, and shall not be restricted or limited by the foregoing description.

What is claimed is:

1. A display device comprising:
   a display panel including:
      an active area displaying an image; and
      a peripheral area surrounding the active area;
   a first light blocking layer disposed on a portion of the peripheral area adjacent to a first side surface of the display panel;
   a second light blocking layer disposed under a portion of the peripheral area adjacent to a second side surface of the display panel, the second side surface connecting the first side surface;
   an upper polarizing film disposed on the display panel, covering a portion of the first light blocking layer and having a first absorption axis; and
   a lower polarizing film disposed under the display panel and having a second absorption axis intersecting the first absorption axis of the upper polarizing film, wherein
   the first absorption axis of the upper polarizing film is parallel to a first direction,
   the first side surface of the display panel is spaced apart from the upper polarizing film in the first direction in a plan view, and
   a portion of the second light blocking layer is covered by the lower polarizing film.

2. The display device of claim 1, further comprising:
   a third light blocking layer disposed on a portion of the peripheral area adjacent to a third side surface of the display panel opposite to the first side surface,
   wherein a portion of the third light blocking layer is covered by the upper polarizing film.

3. The display device of claim 2, wherein
   the first light blocking layer and the third light blocking layer are spaced apart from each other in the first direction, and
   each of the first and third light blocking layers extends in a second direction intersecting the first direction.

4. The display device of claim 2, further comprising:
   first pad parts disposed on the first side surface;
   second pad parts disposed on the third side surface;

first circuit units electrically connected to the first pad parts; and second circuit units electrically connected to the second pad parts, wherein the first pad parts are arranged in a second direction intersecting the first direction, and the second pad parts are arranged in the second direction.

5. The display device of claim 4, wherein the first pad parts and the first light blocking layer include same material, and the second pad parts and the third light blocking layer include same material.

6. The display device of claim 2, further comprising:

a fourth light blocking layer disposed under a portion of the peripheral area adjacent to a fourth side surface of the display panel, the fourth side surface being opposite to the second side surface.

7. The display device of claim 2, further comprising:

an ink layer disposed on the first light blocking layer.

8. The display device of claim 1, wherein the first light blocking layer comprises a first light blocking region disposed on the peripheral area adjacent to the first side surface of the display panel and a second light blocking region disposed on a portion of the first side surface of the display panel.

9. The display device of claim 8, wherein the first light blocking portion and the second light blocking region are integrally formed of a same material.

10. The display device of claim 8, wherein the first light blocking layer has a bent shape as seen in side view.

11. The display device of claim 2, wherein a portion of the upper polarizing film covering the first light blocking layer is configured to be shrunken by at least about 200 micrometers.

* * * * *